United States Patent

Dell et al.

Patent Number: 5,963,464
Date of Patent: Oct. 5, 1999

[54] STACKABLE MEMORY CARD

[75] Inventors: Timothy J. Dell, Colchester; Marc R. Faucher, So. Burlington; Bruce G. Hazelzet, Essex Junction; Dale Edward Pontius, Colchester, all of Vt.

[73] Assignee: International Business Machines Corporation, Armonk, N.Y.

[21] Appl. No.: 09/032,456

[22] Filed: Feb. 26, 1998

[51] Int. Cl.$^6$ .................................................. G11C 5/02
[52] U.S. Cl. .................................. 365/52; 365/51; 365/63
[58] Field of Search .................................. 365/52, 51, 63; 257/686

[56] References Cited

U.S. PATENT DOCUMENTS

| | | | |
|---|---|---|---|
| 4,045,105 | 8/1977 | Lee et al. | 339/17 |
| 4,884,237 | 11/1989 | Mueller et al. | 365/63 |
| 4,888,773 | 12/1989 | Arlington et al. | 371/40.2 |
| 4,967,142 | 10/1990 | Sauerwald et al. | 324/73.1 |
| 5,200,917 | 4/1993 | Shaffer et al. | 365/51 |
| 5,211,565 | 5/1993 | Krajewski et al. | 439/65 |
| 5,481,436 | 1/1996 | Werther | 361/784 |
| 5,514,907 | 5/1996 | Moshayedi | 257/723 |
| 5,758,056 | 5/1998 | Barr | 395/182.05 |

OTHER PUBLICATIONS

IBM Technical Disclosure Bulletin, vol. 38, No. 05 May 1995, pp. 433–434. "Stacked Memory Modules".
IBM Technical Disclosure Bulletin, vol. 37, No. 09 Sep. 1994, pp. 531–532. "Stackable Personal Computer Memory Card International Association Card".
IBM Technical Disclosure Bulletin, vol. 37, No. 10 Oct. 1994, pp. 353–354. "Stacking Single Inline Memory Module Card".

Primary Examiner—David Nelms
Assistant Examiner—Hoai V. Ho
Attorney, Agent, or Firm—William N. Hogg

[57] ABSTRACT

A memory card design which allows for stackable memory cards so that a computer system's memory capabilities can be expanded by connecting a first memory card to sockets of the computer system's motherboard and then stacking subsequent memory cards on top of this first memory card. The memory card design includes connector sockets on a top surface of the card which allow for another card to be plugged into these sockets. Also, a presence detect serial EPROM and steer and encode logic are provided to assign a unique system address to each presence detect. The serial presence detect address select wiring are offset within the stack as are RAS lines so that all lines do not have to be hard-wired through each card of a stack of the present invention.

24 Claims, 3 Drawing Sheets

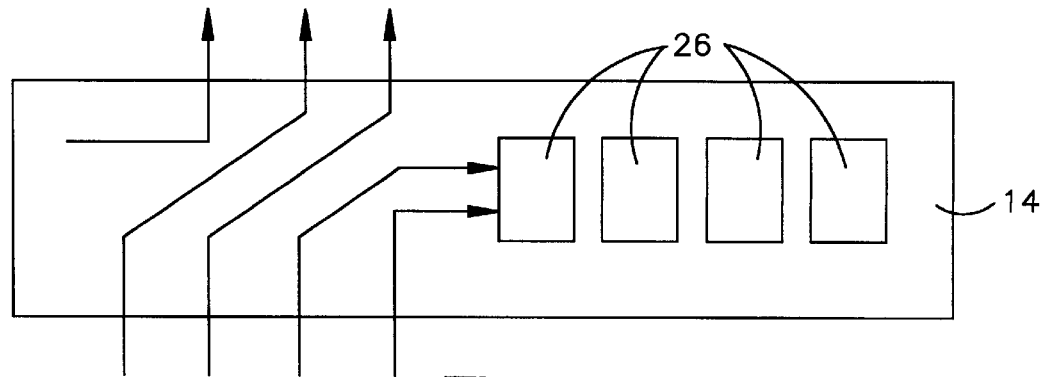
Fig.4
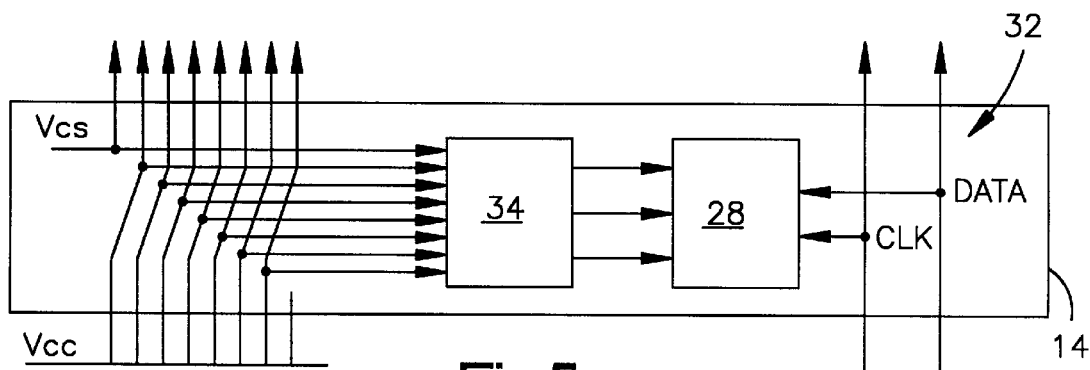
Fig.5
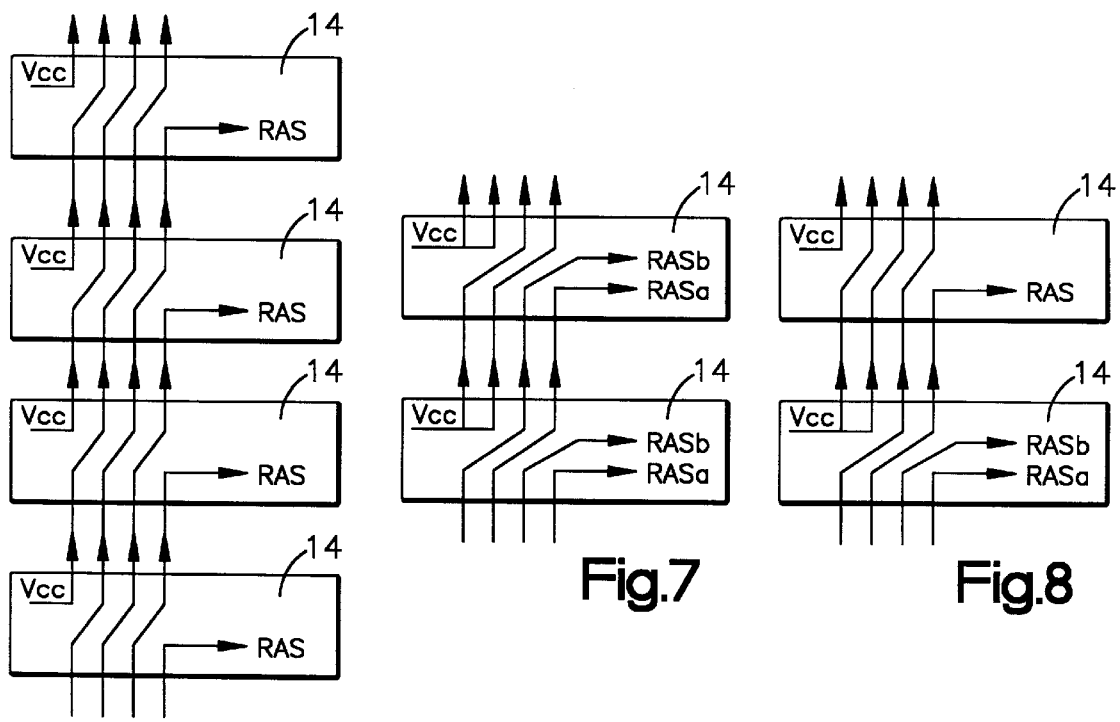
Fig.6
Fig.7
Fig.8

STACKABLE MEMORY CARD

BACKGROUND OF THE INVENTION

Many of today's modern personal computers have memory expansion capabilities. Typically, sockets are provided on a motherboard of a computer system into which memory expansion cards may be plugged. The expansion of a computer's memory by "plugging in" additional memory expansion cards into these sockets is limited both by the actual number of memory card sockets located on the motherboard and the amount of physical space available for memory expansion on the motherboard. Often times a computer system has only four connector sockets on the motherboard capable of supporting add in memory. Thus, in this typical computer system memory expansion is limited.

Besides being limited by the number of available sockets, expansion of memory by addition of memory cards is also limited by the physical space available within the computer housing. For instance, in laptop type computers, the amount of physical space on the motherboard can be extremely limited due to demand for decrease in size of the overall unit. Also, addition of memory into desktop computers is difficult due to high speed memory bus architectures that can exceed the capabilities of current memory card connectors.

SUMMARY OF THE INVENTION

A memory card design is provided which allows for stackable memory cards so that a computer system's memory can be expanded by vertically stacking memory cards on top of one another without using additional motherboard area and board sockets. The stackable memory card design includes connector sockets on each memory card which allow the addition of memory to a computer system by plugging additional memory cards into the sockets of the original memory card. The bottom connector pins of an add-in memory card are connected to the top surface connector of a first memory card which rests at the lowest or bottom level of the subsequently formed stack. The top surface connectors are wired to a corresponding set of connector pins mounted on a bottom surface of the memory card. Except for the master control signal and detection steer logic, the top and bottom surface connectors correspond one to one. The connector sockets and pins allow "added in" memory cards to be stacked and provide a solid base for mechanical stability of the stack of cards. Once a memory card of the present invention is plugged into the motherboard, a subsequent card may be plugged into the first card. Additional cards can be stacked on each other. Thus, a stack may include as many cards as the vertical space available on the motherboard allows and the number of master control signals provided. Also, an embodiment of the invention includes a Serial Presence Detect EPROM steer and encode logic to assign a unique system address to the Serial Presence Detect EPROM. In this embodiment, bus lines are routed through the stack in an offset pattern.

Thus, one aspect of the present invention is that a stackable memory card design is provided to minimize the amount of physical board space and number of board sockets needed to expand a computer system's memory.

Another aspect of the present invention is that memory cards are provided with surface sockets so that a memory card may be plugged into another memory card upon which the inserted memory card rests.

A further aspect of the present invention is that the row address strobe ("RAS") lines are routed through each card for the entire stack of cards, but the lines are routed in an offset pattern so that each card utilizes only a minimum number of lines.

Yet another aspect of the present invention is that Serial Presence Detect EPROM are provided so that all cards in a stack are recognizable to the computer system.

BRIEF DESCRIPTION OF THE DRAWINGS

FIG. 4 illustrates a functional diagram of offset RAS wiring for a two bank stackable memory module system for an embodiment of the present invention;

FIG. 5 illustrates a functional diagram of offset presence detect address wiring of the present invention;

FIG. 6 illustrates a functional diagram of the RAS connection for a stack of single bank stackable memory module memory cards of the present invention;

FIG. 7 illustrates a functional diagram of the RAS connection for a stack of dual bank stackable memory module memory cards of the present invention;

FIG. 8 illustrates a functional diagram of the RAS connection for a stack of dual bank to single bank stackable memory modules of the present invention.

DETAILED DESCRIPTION OF THE INVENTION

The present invention can exist in any number of environments but will be described in the environment of an IBM compatible Personal Computer using a x86 microprocessor such as the Intel Pentium® or Pentium® II.

Figure 1:
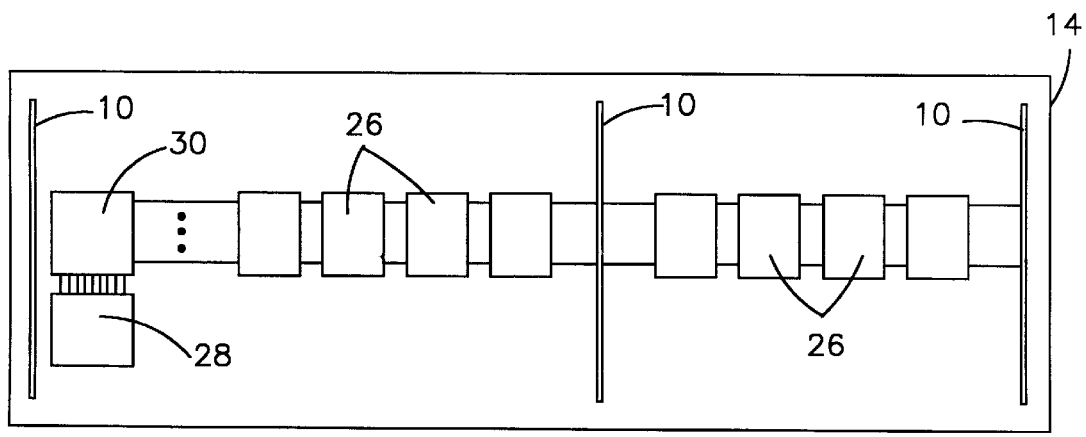
FIG. 1 illustrates a top plan view schematic of a memory card design of the present invention.
Figure 2:
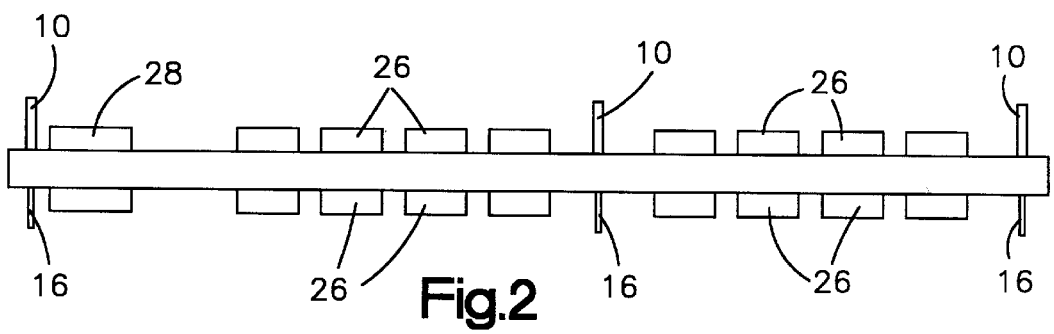
FIG. 2 illustrates a side elevational view schematic of a memory card the present invention.

FIGS. 1 and 2 illustrate a memory card designed for providing base system memory or extending or adding on memory into a computer system. The memory card includes connector sockets on a top surface of the memory card which allows for other memory cards to be added to the computer system by plugging an additional memory card into the original memory card to yield a stackable memory card design.

Figure 3:
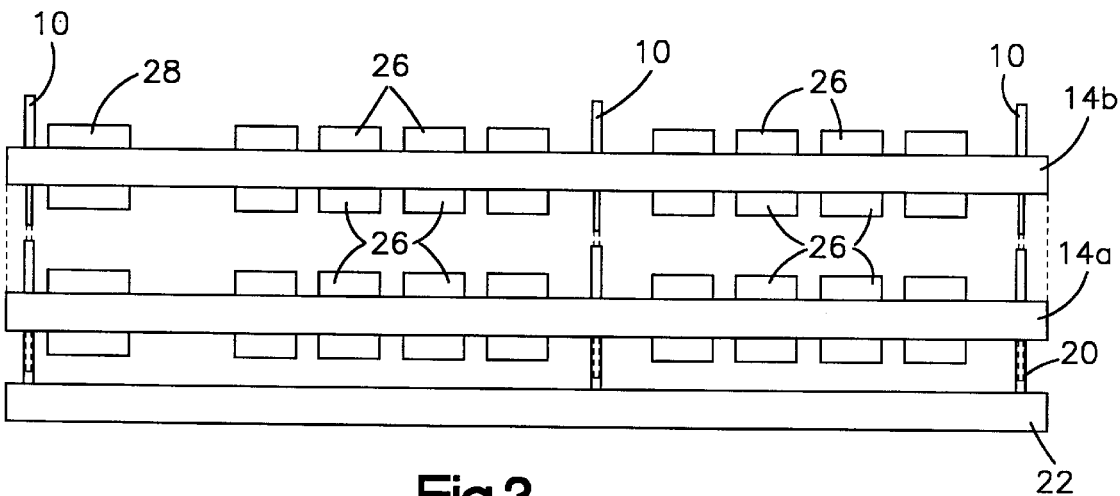
FIG. 3 illustrates a side elevational view schematic of a stack of memory cards of the present invention.

In one embodiment, connector sockets 10 are mounted on a top surface 12 of a memory card 14 and wired to a corresponding set of connector pins 16 mounted on a bottom surface 18 of the memory card 14. The connector sockets 10 are capable of accepting an additional add-in memory card by insertion of respective connector pins 16 on a bottom surface of the additional add-in card 14. By inserting a card into these sockets, a stack of add-in memory cards can be formed in a limited amount of physical space as shown in FIG. 3 while utilizing only a single connector socket set 20 on the motherboard 22 of a computer and only taking up limited physical space in the computer system. Furthermore, the connector sockets 10 and connector pins 16 provide a solid base to ensure mechanical stability of a stack of memory cards.

As seen in FIG. 1, a stackable memory module of the present invention includes a plurality of dynamic random access memory ("DRAM") chips 26 incorporated onto the stackable memory module 14. Also, the stackable memory module includes serial presence detect information containable in erasable programmable read only memory ("EPROM") 28 and hard wired "steer" decode logic 30. The steer decode logic 30 assigns a unique system address to the serial presence detect EPROM 28 of the card.

FIG. 2 illustrates a side view of a stackable memory module of the present invention. As can be seen in FIG. 2, a stackable memory module is provided with connector sockets 10 on its top surface 12 capable of receiving a memory card 14. These connector sockets 10 are similar to the connector sockets 20 located on the computer system's motherboard 22. Like the motherboard's socket 20, the stackable memory module connector sockets 16 are capable of receiving a stackable memory module 14. Also, the stackable memory module has connector pins 16 on its bottom surface capable of being plugged into the connector sockets 20 locatable on a motherboard 22 or into connector sockets 16 on a stackable memory module 14 of the present invention. Thus, by plugging the pins 16 of a first stackable memory module into the connector sockets 20 of the motherboard 22 and then plugging the pins 16 of a second stackable memory module 14 into the connector sockets 10 of the first stackable memory module 14, a stack of memory cards may be formed as shown in FIG. 3. Subsequent stackable memory modules 14, may be added to the stack depending upon the physical space available in the computer system in a vertical direction and also upon how much memory the user of the computer system wishes to add to the system, and the number of unique control lines such as RAS that are provided by the system.

FIG. 3 illustrates a stack of stackable memory modules formed of stackable memory cards the present invention. As shown, a first stackable memory module, (designated 14a only to distinguish this module from subsequent modules, it being understood that each module 14 is identical), has its connector pins 16 inserted into connector sockets 20 located on the motherboard 22. A second stackable memory module, (14b to distinguish it from 14a), is connected to the first stackable memory module 14a by having its connector pins 16 inserted into the connector sockets 10 of the first stackable memory module 14a. By connecting these stackable memory modules 14, the second stackable memory module 14b is in communication with the first stackable memory module 14a and ultimately the motherboard 22. While only two stackable memory modules 14a and 14b are shown in the stack of FIG. 3, it is contemplated that stacks may be created from multiple stackable memory modules depending upon the amount of vertical space available in a computer system's housing, and the number of unique control signals provided by the system.

In typical computer system with multiple sets of sockets—one socket for each potential add-in memory module, any unused socket performs no function and serves only to waste space until it is needed for memory expansion. Additionally, each socket receives its own unique master control signal, such as RAS, to actuate the memory module in that socket when it is required by the system. Thus the number of memory expansion sockets in a system is limited both by space and the number of master control signals that are provided.

As best illustrated in FIG. 4, the wiring scheme of the one embodiment of the present invention utilizes an offset wiring design. In a preferred embodiment of the invention, an offset wiring scheme is used to allow communication between the computer system's motherboard and the stack of memory cards while minimizing the amount of bus lines required for this communication and allowing each stackable memory module to assume any position in the stack. In this one embodiment, the offset wiring scheme is necessary because the number of cards in each stack can vary. The user of the computer system may decide to expand the system's memory by adding a number of stackable memory modules of the present invention. While the stack could be hard wired together before placement in the computer so that the computer would know exactly how many stackable memory modules are in the stack, however, this would eliminate the flexibility of allowing the user to determine how much memory should be added for the particular needs of a particular computer system. This flexibility is lost with a "hard-wired" system because the stack must be preformed with a set number of stackable memory modules for such a "hard-wired" device. Alternatively, different wiring schemes could be provided on each successive module 14, but this would require different part numbers and a user awareness of the stack order of the modules. Instead, the present invention allows for any number of stackable memory modules less than or equal to the maximum to be in the stack with the offset wiring scheme permitting the computer system to recognize the number of stackable memory modules in the stack and communicate with a specified stackable memory module of the stack when the system only needs to communicate with that specific stackable memory module, and only a single module configuration of wiring is needed irrespective of where in the stack the module 14 is used.

In FIG. 4, the offset RAS wiring scheme is illustrated for an embodiment utilizing a 2-bank, DRAM based stackable memory module. The RAS control lines are routed through each card for the entire stack of memory cards in an offset pattern. In this embodiment, the RAS lines are offset wired such that for a two-bank stackable memory module having four RAS lines, two RAS lines RASa and RASb are routed to memory devices 26 on that stackable memory module card with the remaining RAS lines (RASc and RASd) routed through the stackable memory module to the next stackable memory module 14 in the stack. The remaining RAS lines routed through the stackable memory module 14 are shifted over by the number of RAS lines utilized by that stackable memory module 14. Thus, if the stackable memory modules uses two RAS lines RASa and RASb, the remaining RAS lines are shifted two positions for the next card in the stack with Vcc lines filling the two offset positions as the lines proceed to the next card in the stack. This will allow any particular stackable memory module to be used in any position in the stack up to the maximum number of positions in the stack.

As illustrated in FIG. 5, each memory card contains a serial presence detect EPROM 28 ("presence detect"). The presence detect EPROM 28 is a circuit that can be used by the computer system to recognize the attributes of each stackable memory module. In one embodiment, the invention utilizes a presence detect address bus with the offset wiring scheme as shown in FIG. 5. The presence detect EPROM 28 is connected to a presence detect bus 32 that is typically provided by the computer system. A priority encoder 34 is used to provide an addresses to the EPROM 28. Preferably, the priority encoder is an 8 to 3 priority encoder 34 such as the Texas Instruments 74F148. However, it is contemplated that other priority encoders could also be utilized.

The 8 to 3 encoder is utilized because EPROMs typically recognize up to 8 unique addresses encoded by 3 decodable address bits. In the memory card stack, all the EPROMs 28 of each stackable memory module in the stack are connected together on the bus 32. When an address request is sent, the sent address is transmitted to all stackable memory modules, but only the correct module responds by matching the sent address to the encoder provided address. As will be seen presently, this scheme provides the bottom stackable memory module with address "000", the next highest memory in the stack with "001", up to the eighth card in the stack which has address "111" assigned. By matching these addresses, the proper stackable memory module in the stack is chosen for communication with the motherboard. Each stackable memory module in the stack has a unique 3 bit encoder address, thus this address is used to ensure that the correct stackable memory module's serial presence detect data is selected by the computer system. The offset wiring used with the presence detect is such that one presence detect line is tied to ground with each remaining presence detect line offset by one bit. By using this offset wiring scheme, a unique address assignment is presented to each memory card regardless of the order in which the cards are connected together in the stack. Also, FIG. 5 shows that the data and clock lines are serially connected to the stackable memory module stack for communication with the presence detect to provide each stackable memory module in the stack with the serial PD bus 32.

FIG. 6 illustrates a stack of memory modules 14 of the present invention in which the RAS connection for a stack of single bank stackable memory modules is shown. The RAS is the primary control signal. In a stack utilizing single bank stackable memory modules, each stackable memory module requires only one RAS line RASa. Thus, each stackable memory module 14 is provide with RAS lines that are offset by one line for each stackable memory module. Likewise, FIGS. 7 and 8 illustrate the offset patterns respectively for a dual bank stack and a single to dual bank stack. The base socket on the motherboard has each RAS line set to a corresponding pin. The RAS must be offset as it goes up the stack so that each module 14 gets one RAS line to that module on the same pin as the module below, while allowing the other RAS lines to pass through, offset by one. It is contemplated that RAS can be replaced by Chip Select as the primary control signal, rather than RAS, for synchronous DRAM embodiments.

In typical, non-stacked memory module systems, several DIMM sockets (usually 2 to 8) are provided for base memory (what gets shipped with the computer system from the factory) and expansion or add-on memory. As is well known in the art, each socket provides a unique three bit address to the DIMM plugged into it by connecting each of the three bits to either Vcc (logical "1") or Ground (logical "0"). Thus each DIMM receives an address "000," "001,". . . "111, " which in binary fashion represent eight addresses, 0–7. Then, as is also well known in the art, the computer can uniquely address each DIMM's serial PD data by sending an address (0–7) over the common SPD bus (clock and data). If a DIMM is plugged in a socket that supplies the same address that the system is transmitting over the SPD bus, then that DIMM responds to the system using the standard SPD protocol. If no DIMM is present, then nothing will happen in response to the system's query. In this manner, the system can poll all eight addresses, and therefore all eight sockets, to ascertain if a DIMM is present, and, if so, what its attributes are.

In the stackable memory module system contemplated by this invention, however, there is only one socket or socket set on the computer system motherboard. Therefore, it is impossible to provide a unique address to each memory module in the stack in a conventional manner. This limitation is overcome, however, by a further embodiment of the present invention that can be best described by referring to FIG. 9.

Figure 9:
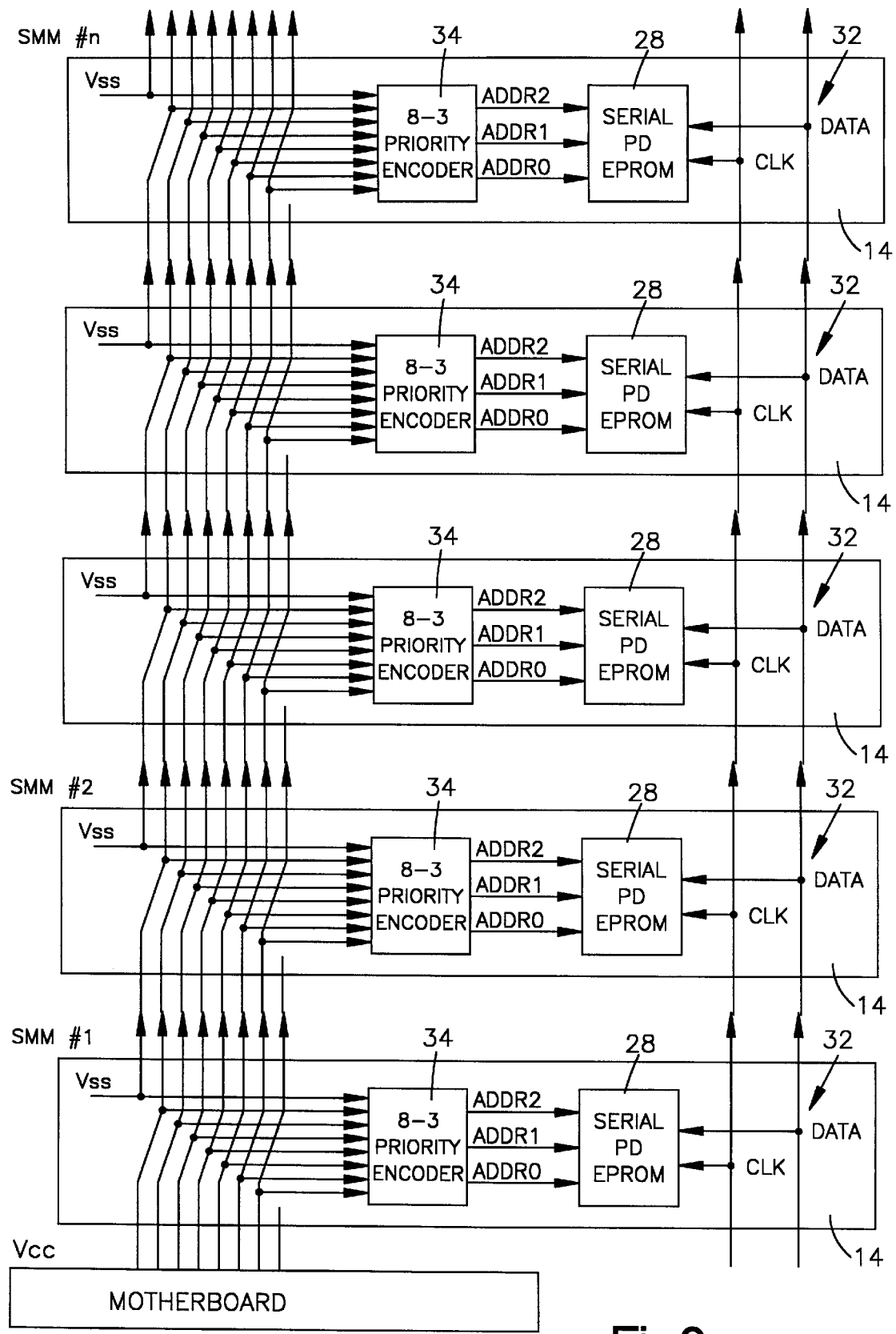
FIG. 9 illustrates a functional diagram of the serial presence detect configuration of a stack of memory cards of the present invention.

As shown in FIG. 9, the present invention provides a way to allow each card in a stackable memory module stack to have exactly the same wiring for the Serial PD structure, and yet provide a unique three bit encoded address to each EPROM. Additionally, the order of the Stackable Memory Module (SMM) in the stack does not affect the generation of the address.

The first SMM of the stack is plugged into the motherboard. Eight signals in the connector are defined to provide the unique addressing function in addition to the SPD standard clock and data signals. It should be noted that additional signals can easily be added in like manner to extend the unique addressing capability to beyond eight addresses, i.e., 16 or 32 addresses. However, the preferred embodiment is 8 because of general acceptance in the industry of 2 to 8 base and expansion "sockets" as being sufficient for most computer applications.

The eight signals are all tied to Vcc or logic "1" at the motherboard. The first SMM in the stack receives all eight "1's" and shifts them over one offset position and then passes them along out of the top surface connector. In addition, one of the eight signals leaving the SMM on the top surface has been connected to Vss or Ground or logic "0" on the SMM. The manner of the offset and introduction of a logic "0" into the eight bit unique address signal bus is arbitrary. Any scheme will work as long as it is consistent on all SMMS. The scheme shown in FIG. 9 is preferred because it is straight forward and provides a gapless binary count to each layer of the stack, i.e., SMM #1 is provided address "000," SMM #2 is provided "001," up to SMM #8 which is provided address "111," as will be described next.

The offset wiring scheme is used to provide a monotonically increasing number of logic "0's" as inputs to the priority encoder. Thus in the preferred embodiment, the first SMM in the stack has one "0" and seven "1's". The priority encoder translates this input into a three bit encoded input address of "111", which is fed to the SPD EPROM as its address inputs. The next SMM in the stack has two "0's" and six "1's", which it encodes into an address of "110", and passes that along to its SPD EPROM. This process continues until the eighth SMM in the stack is reached where the offset wiring will produce eight "0's" and zero "1's" for the priority encoder, which in turn generates a three bit encoded address of "000" for its SPD EPROM to use as its "match" address.

Thus in this manner, each SMM in a stack gets, by virtue of the offset wiring and 8-3 encoder, a unique three bit address assigned to its SPD EPROM, which in turn allows the system to poll each SMM in the stack in turn while still using the industry standard two bit SPD bus.

While the present invention has been illustrated by the description of the embodiments thereof, and while these embodiments have been described in considerable detail, it is not the invention to restrict or in any way limit the scope of the appended claims to such detail. Additional advantages and modifications may readily appear to those skilled in the art. Therefore, the invention, in its broadest aspects is not limited to the specific details, the representative apparatus, and illustrative examples shown and described. Accordingly, departures may be made from such details without departing from the spirit or scope of the applicant's general inventive concept.

We claim:

1. A memory assembly having a plurality of memory cards comprising:
   a) connectors locatable on a top surface and a bottom surface of each card configured to interconnected one card with another in face to face relationship;

b) a presence detect logic information on each card;

c) encoding logic capable of selecting the proper presence detect logic in a stack of memory cards; and d) offset serial presence detect address select wiring including offset RAS wiring.

2. The memory card assembly of claim 1 wherein the memory cards are dual in-line memory modules.

3. The memory card assembly of claim 1 further comprising steering and decoding logic.

4. The memory card assembly of claim 3 further comprising a priority encoder in communication with the presence detect logic information.

5. The memory card assembly of claim 4 wherein the priority encoder is an 8 to 3 priority encoder.

6. The memory card assembly of claim 5 further comprising data and clock lines in serial communication with the plurality of memory cards.

7. The memory card of claim 1, wherein said presence detect logic is included on an EPROM.

8. A stackable memory card comprising:

a) connector sockets locatable on a first surface of the card;

b) connector pins locatable on a second surface of the card opposite to said first surface;

c) a presence detect logic information;

d) a priority encoder in communication with the presence detect information;

e) a plurality of DRAMs;

f) encoding logic capable of selecting the presence detect logic information; and g) offset serial presence detect address select wiring including offset RAS wiring.

9. The memory card of claim 8 wherein the priority encoder is an 8 to 3 priority encoder.

10. The memory card of claim 8 wherein the memory card is a dual-inline memory module.

11. The memory card of claim 8, wherein said presence detect logic information is included on an EPROM.

12. A stackable memory module comprising;

a printed circuit card having a top surface with a first top surface contact thereon and a bottom surface with a first bottom surface connector thereon;

at least one electrical device mounted on said printed circuit card;

first circuitization connecting said first bottom surface connector to said first top surface connector, said first circuitization being tapped into by said at least one electrical device; and a second top surface connector and a second bottom surface connector, second circuitization for transmission of a control signal from said second top surface connector to said second bottom surface connector which is offset from said second top surface connector.

13. The memory card assembly of claim 12 wherein the memory cards are dual in-line memory modules.

14. The memory card assembly of claim 13 further comprising steering and decoding logic.

15. The memory card assembly of claim 14 further comprising a priority encoder in communication with the presence detect information.

16. The memory card assembly of claim 15 wherein the priority encoder is an 8 to 3 priority encoder.

17. The memory card assembly of claim 16 further comprising data and clock lines in serial communication with the plurality of memory cards.

18. A method of adding memory to a motherboard in a computer system comprising the steps of:

providing a first printed circuit card having a top surface with a first top surface contact thereon and a bottom surface with a first bottom surface connector thereon;

at least one electrical device mounted on said printed circuit card;

providing first circuitization connecting said first bottom surface connector to said first top surface connector, said first circuitization being tapped into by said at least one electrical device;

providing a second top surface connector and a second bottom surface connector, providing second circuitization for transmission of a control signal from said second top surface connector to said second bottom surface connector which is offset from said second top surface connector; and connecting the first bottom surface connection to a computer system motherboard to thereby shift at least one signal from said motherboard to said offset second top surface connector.

19. The invention as defined in claim 18, wherein said at least one signal is a RAS signal.

20. The invention as defined in claim 18, further characterized by providing a second printed circuit card substantially identical to said first circuit card, and connecting the first bottom surface connector of said second circuit card to the first top surface contact on said first printed circuit card to thereby offset at least one signal received from said first card one position from said first card and two positions from said motherboard.

21. The invention as defined in claim 20, wherein the memory cards are dual in-line memory modules.

22. The invention as defined in claim 20, further comprising steering and decoding logic on each of said printed card.

23. The invention as defined in claim 22, further comprising a priority encoder in communication with the presence detect information.

24. The invention as defined in claim 21, further comprising providing data and clock lines in serial communication with each of the memory cards.

* * * * *